(12) United States Patent
Choi

(10) Patent No.: US 11,721,615 B2
(45) Date of Patent: Aug. 8, 2023

(54) COUPLED SEMICONDUCTOR PACKAGE

(71) Applicant: JMJ Korea Co., Ltd., Bucheon-si (KR)

(72) Inventor: Yun Hwa Choi, Bucheon-si (KR)

(73) Assignee: JMJ Korea Co., Ltd., Bucheon-si (KR)

( * ) Notice: Subject to any disclaimer, the term of this patent is extended or adjusted under 35 U.S.C. 154(b) by 110 days.

(21) Appl. No.: 17/227,357

(22) Filed: Apr. 11, 2021

(65) Prior Publication Data
US 2022/0051969 A1 Feb. 17, 2022

(30) Foreign Application Priority Data
Aug. 12, 2020 (KR) .................. 10-2020-0101183
Mar. 5, 2021 (KR) .................. 10-2021-0029564

(51) Int. Cl.
| H01L 23/495 | (2006.01) |
| H01L 23/31 | (2006.01) |
| H01L 23/373 | (2006.01) |
| H01L 23/00 | (2006.01) |

(52) U.S. Cl.
CPC .... *H01L 23/49537* (2013.01); *H01L 23/3107* (2013.01); *H01L 23/3735* (2013.01); *H01L 23/4952* (2013.01); *H01L 23/49513* (2013.01); *H01L 23/49568* (2013.01); *H01L 23/49575* (2013.01); *H01L 24/32* (2013.01); *H01L 24/48* (2013.01); *H01L 24/73* (2013.01); *H01L 2224/32225* (2013.01); *H01L 2224/48175* (2013.01); *H01L 2224/73265* (2013.01); *H01L 2924/15787* (2013.01)

(58) Field of Classification Search
CPC .......... H01L 23/49537; H01L 23/3107; H01L 23/3735; H01L 23/49513; H01L 23/4952; H01L 23/49575; H01L 24/32; H01L 24/48; H01L 24/73
See application file for complete search history.

(56) References Cited

U.S. PATENT DOCUMENTS

| 8,901,723 | B2 | 12/2014 | Spann et al. | |
| 9,224,677 | B1 * | 12/2015 | Liou | H01L 23/49575 |
| 9,716,057 | B1 * | 7/2017 | Zhang | H01L 25/18 |
| 2019/0326234 | A1 * | 10/2019 | Benson | H01L 23/3677 |
| 2020/0343166 | A1 * | 10/2020 | Bonifacio | H01L 23/49503 |

FOREIGN PATENT DOCUMENTS

| JP | 2009-516907 A | 4/2009 |
| JP | 2013-069911 A | 4/2013 |
| KR | 10-0685253 B1 | 2/2007 |
| KR | 10-0902766 B1 | 6/2009 |
| KR | 10-2009-0104478 A | 10/2009 |
| KR | 10-1448850 B1 | 10/2014 |

* cited by examiner

*Primary Examiner* — Marc Anthony Armand
(74) *Attorney, Agent, or Firm* — Park, Kim & Suh, LLC

(57) ABSTRACT

Provided is a coupled semiconductor package including at least two substrate pads; at least one semiconductor chip installed on each of the substrate pads; at least one terminal each of which is electrically connected to each substrate pad and each semiconductor chip; and a package housing covering a part of the at least one semiconductor chip and the at least one terminal, wherein lower surfaces of one or more substrate pads are formed to be electrically connected and lower surfaces of another one or more substrate pads are formed to be electrically insulated. Accordingly, partial insulation may be economically realized without applying an insulating material to a heat sink, when the package is joined to the heat sink.

13 Claims, 8 Drawing Sheets

COUPLED SEMICONDUCTOR PACKAGE

CROSS-REFERENCE TO RELATED PATENT APPLICATION

This application claims the benefit of Korean Patent Application No. 10-2020-0101183, filed on Aug. 12, 2020 and No. 10-2021-0029564, filed on Mar. 5, 2021 in the Korean Intellectual Property Office, the disclosure of which is incorporated herein in its entirety by reference.

BACKGROUND OF THE INVENTION

1. Field of the Invention

The present invention relates to a coupled semiconductor package where lower surfaces of one or more substrate pads are formed to be electrically connected and lower surfaces of another one or more substrate pads are formed to be electrically insulated so that insulation may be partly realized without applying of an insulating material to a heat sink, when the package is joined to the heat sink.

2. Description of the Related Art

In general, since a package type power semiconductor device radiates heat at an unnecessarily high-temperature environment due to electric power generated while driving, it is important to cool down the temperature to an optimum level and to minimize thermal resistance.

Figure 1:
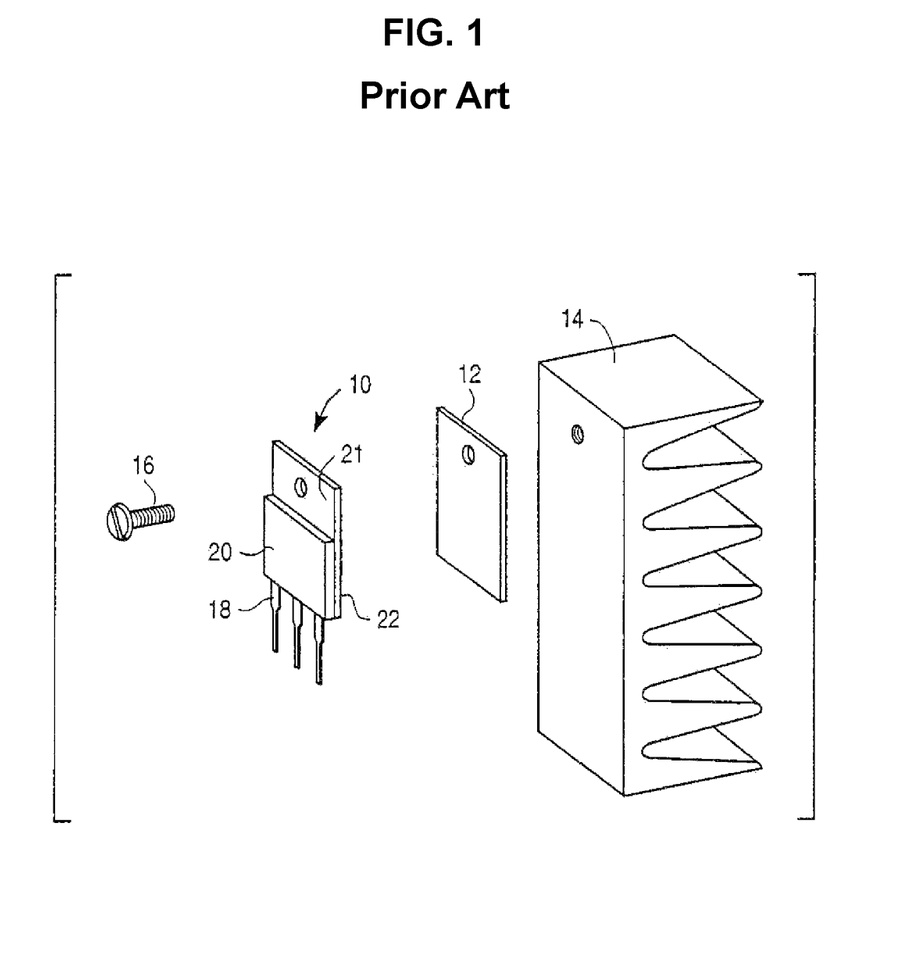
FIG. 1 illustrates a semiconductor package according to a conventional art.

In regard to this, as a heat radiation structure, a package type power semiconductor device 10, an insulating pad 12, and a heat sink 14 are illustrated in FIG. 1. Here, a semiconductor chip is bonded to a metal tap 21 and is sealed using a sealing material 20 so that heat may be radiated through the heat sink 14 bonded to the insulating pad 12 interposed therebetween.

Accordingly, each semiconductor device needs a separate insulating pad or an insulating material applied thereto in order to combine with a heat sink.

Therefore, without applying of an insulating material to the heat sink, a technique to realize partial insulation is required in more economical way to combine with the heat sink.

SUMMARY OF THE INVENTION

The present invention provides a coupled semiconductor package where lower surfaces of one or more substrate pads are formed to be electrically connected and lower surfaces of another one or more substrate pads are formed to be electrically insulated so that insulation may be partly realized without applying of an insulating material to a heat sink, when the package is joined to the heat sink.

According to an aspect of the present invention, there is provided a coupled semiconductor package including: at least two substrate pads; at least one semiconductor chip installed on each of the substrate pads; at least one terminal each of which is electrically connected to each substrate pad and each semiconductor chip; and a package housing covering a part of the at least one semiconductor chip and the at least one terminal, wherein lower surfaces of one or more substrate pads are formed to be electrically connected and lower surfaces of another one or more substrate pads are formed to be electrically insulated.

The lower surfaces of one or more substrate pads may be partly or entirely exposed to the outside of one surface of the package housing so as to be electrically connected and the lower surfaces of another one or more substrate pads may not be exposed to the outside of the package housing so as to be electrically insulated.

The substrate pads may be formed of a conductive metal.

One or more substrate pads may be formed of a conductive metal, the lower surfaces thereof may be partly or entirely exposed to the outside of one surface of the package housing so as to be electrically connected, another one or more substrate pads may be formed of an insulating substrate including an insulating layer formed thereon, and the lower surfaces of the insulating substrates may be partly or entirely exposed to the outside of one surface of the package housing so as to be electrically insulated.

The package housing may be formed of an epoxy molding compound (EMC).

Another one or more substrate pads may be formed of at least one metal layer, at least one insulating layer, and at least one metal layer, which are sequentially stacked.

The insulating layer may include ceramic ($Al_2O_3$), AlN, or $Si_3N_4$.

One or more substrate pads and one or more terminals may be formed of the same material and connected to each other as in one body.

One or more substrate pads and one or more terminals may be separately formed and connected to each other using ultrasonic welding, soldering, or laser welding.

The terminals may contain more than 40 weight % of Al with respect to the total weight of the terminals.

The package housing may include one or more penetration holes.

One or more substrate pads may include holes that correspond to one or more penetration holes.

The coupled semiconductor package may further include a heat sink combined using a connecting means which penetrates the penetration holes and the holes.

The lower surfaces of one or more substrate pads may be exposed to the outside of one surface of the package housing by more than 90% of the area of the lower surfaces of the substrate pads.

The at least one semiconductor chip and the at least one terminal may be formed of Au, Al, or Cu as a single material so as to be electrically connected to each other, or may be formed of a combined material including at least any one of Au, Al, and Cu so as to be electrically connected to each other.

The at least one semiconductor chip and the at least one terminal may be electrically connected to each other using a conductive wire.

The at least one semiconductor chip and the at least one terminal may be electrically connected to each other using a metal clip.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in more detail with reference to the accompanying drawings to be easily implemented by those of ordinary skill in the art. This invention may be embodied in many alternate forms and should not be construed as limited to only the exemplary embodiments set forth herein.

A coupled semiconductor package according to the present invention includes at least two substrate pads 110, at least one semiconductor chip 120 installed on each of the substrate pads 110, at least one terminal 130 each of which is electrically connected to each substrate pad 110 and each semiconductor chip 120, and a package housing 140 covering a part of the at least one semiconductor chip 120 and the at least one terminal 130. Here, lower surfaces of one or more substrate pads 110 are formed to be electrically connected and lower surfaces of another one or more substrate pads 110 are formed to be electrically insulated so that insulation may be partly realized without applying of an insulating material to a heat sink, when the package is joined to the heat sink.

Hereinafter, the coupled semiconductor package described above will be respectively described in first through third embodiments according to the structure classified by the type of the substrate pads 110 exposed to the outside of the package housing 140.

Figure 2A:
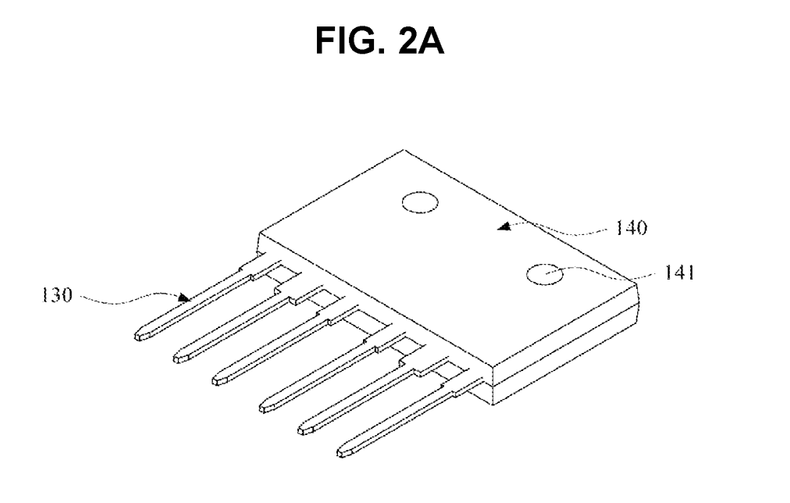
FIGS. 2A and 2B illustrate a coupled semiconductor package according to a first embodiment of the present invention.

The coupled semiconductor package according to the first embodiment of the present invention is described in more detail below with reference to FIGS. 2A through 3.

Firstly, the substrate pads 110 are lead frames, where the semiconductor chips 120 are installed, and the at least two substrate pads 110 are separately molded in the package housing 140. Also, the lower surfaces of one or more substrate pads 110 are formed to be electrically connected and the lower surfaces of another one or more substrate pads 110 are formed to be electrically insulated.

Figure 2B:
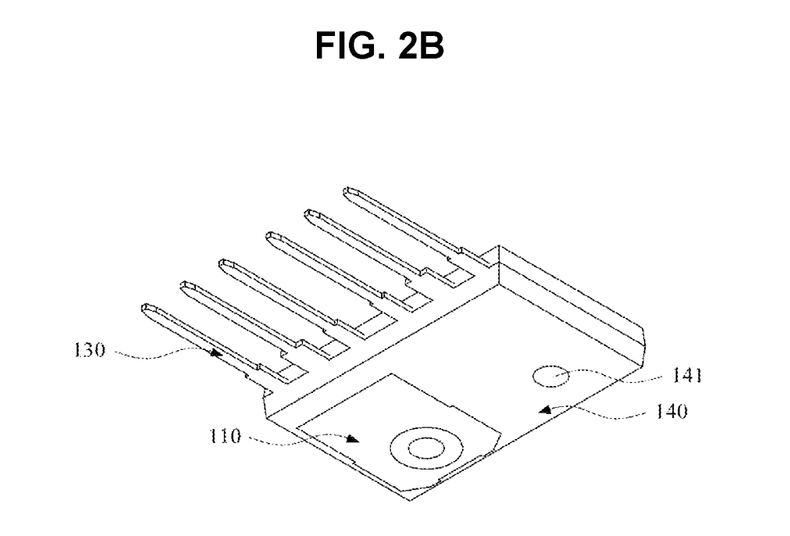
Figure 3:
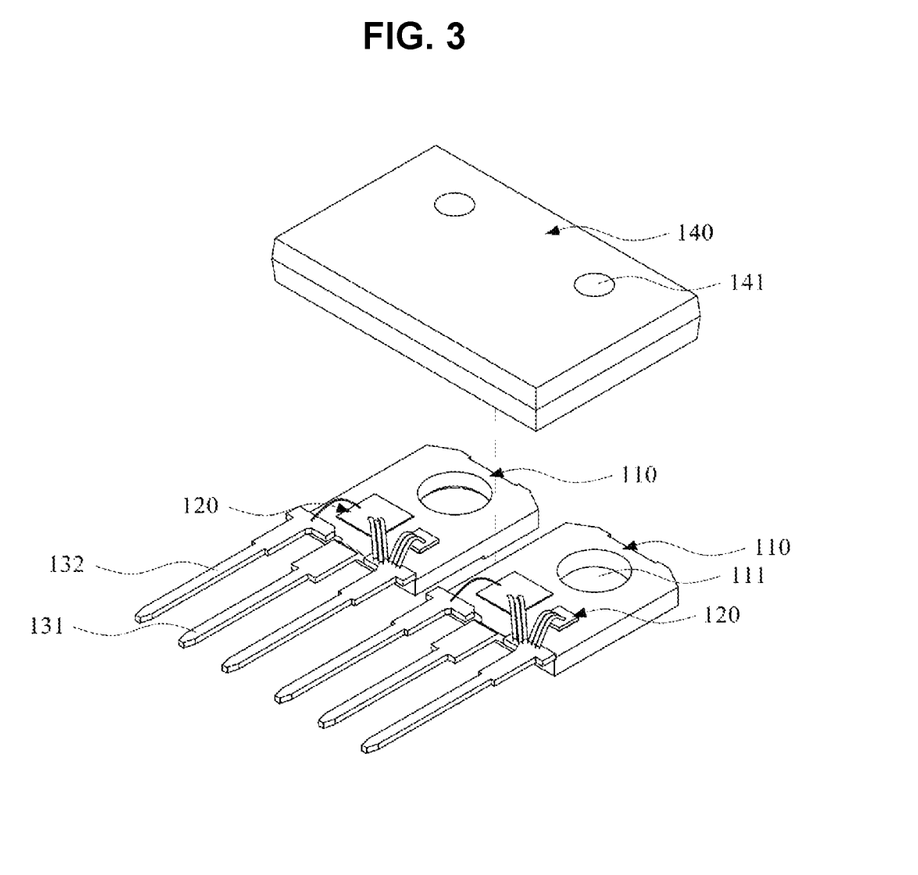
FIG. 3 is an exploded perspective view of the coupled semiconductor package of FIGS. 2A and 2B.

As illustrated in FIG. 2B, the substrate pads 110 are formed of a conductive metal, the lower surfaces of one or more substrate pads 110 are exposed to the outside of one surface of the package housing 140 so as to be electrically connected, and the lower surfaces of another one or more substrate pads 110 are not exposed to the outside of the package housing 140 so as to be electrically insulated. Accordingly, insulation may be partly realized when the package is joined to a heat sink (not illustrated).

The lower surfaces of one or more substrate pads 110 may be partly or entirely exposed to the outside of the package housing 140. For example, more than 90% of the area of the lower surfaces of one or more substrate pads 110 is exposed to the outside of one surface of the package housing 140 so as to maximize heat radiation effect.

In this regard, when insulation of a heat sink is needed, a separate insulating material is not needed to be applied to the heat sink and thus, a process of manufacturing a semiconductor package may be simplified.

Next, one or more semiconductor chips 120 are installed on each of the substrate pads 110 by using a conductive adhesive interposed therebetween.

For reference, the conductive adhesive may contain more than 40% of Sn or more than 50% of Ag or Cu, however, the present invention is not limited thereto. Also, a silicon control rectifier (SCR), a power transistor, an insulated gate bipolar transistor (IGBT), a metal-oxide semiconductor field effect transistor (MOSFET), a power rectifier, a power regulator, or a power semiconductor including a combination thereof may be applied as the semiconductor chip 120.

Next, each of the terminals 130 is electrically connected to each of the substrate pads 110 and each of the semiconductor chips 120 and may include a first terminal 131 electrically connected to the substrate pad 110 and a second terminal 132 electrically connected to the semiconductor chip 120.

The first terminal 131, which is a lead terminal applying an electric signal to the substrate pad 110, is electrically connected to the substrate pad 110, wherein one or more substrate pads 110 and one or more terminals 130 may be formed of the same material and connected to each other as in one body. Also, one or more substrate pads 110 and one or more terminals 130 may be separately formed and connected to each other using ultrasonic welding, soldering, or laser welding.

Here, the terminals 130 may contain more than 40 weight % of Al with respect to the total weight of the terminals 130 so that weight lighting may be realized and conductivity may be improved.

In addition, one or more semiconductor chips 120 and one or more terminals 130 may be formed of Au, Al, or Cu as a single material and electrically connected to each other. Also, one or more semiconductor chips 120 and one or more terminals 130 may be formed of a combined material including at least any one of Au, Al, and Cu and electrically connected to each other. Here, electrical connection may be, for example, a wire.

Moreover, one or more semiconductor chips 120 and one or more terminals 130 may be electrically connected to each other through a metal clip and thus, electrical stability may be secured.

Next, the package housing 140 is an insulator for protecting a semiconductor circuit, partially covers one or more semiconductor chips 120 and one or more terminals 130, and may be formed of an epoxy molding compound (EMC). However, the present invention is not limited thereto and the package housing 140 may be formed of polyphenylene sulfide (PPS) or polybutylene terephthalate (PBT).

The package housing 140 includes at least one penetration hole 141 and the substrate pad 110 includes a hole 111 that corresponds to the penetration hole 141. Accordingly, the package housing 140, the substrate pad 110, and a heat sink may be combined to each other through screw tightening.

Figure 4A:
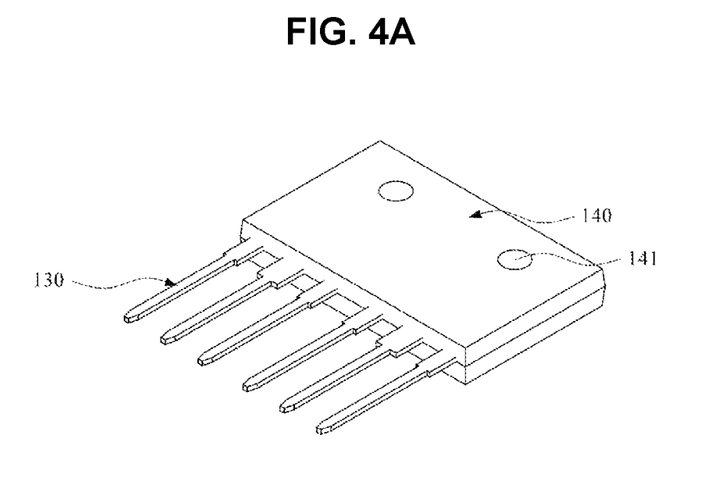
FIGS. 4A and 4B illustrate a coupled semiconductor package according to a second embodiment of the present invention.

The coupled semiconductor package according to the second embodiment of the present invention is described in more detail below with reference to FIGS. 4A through 5.

Firstly, the substrate pads 110 are lead frames, where the semiconductor chips 120 are installed, and the at least two substrate pads 110 are separately molded in the package housing 140. Also, the lower surfaces of one or more substrate pads 110 are formed to be electrically connected and the lower surfaces of another one or more substrate pads 110 are formed to be electrically insulated.

Figure 4B:
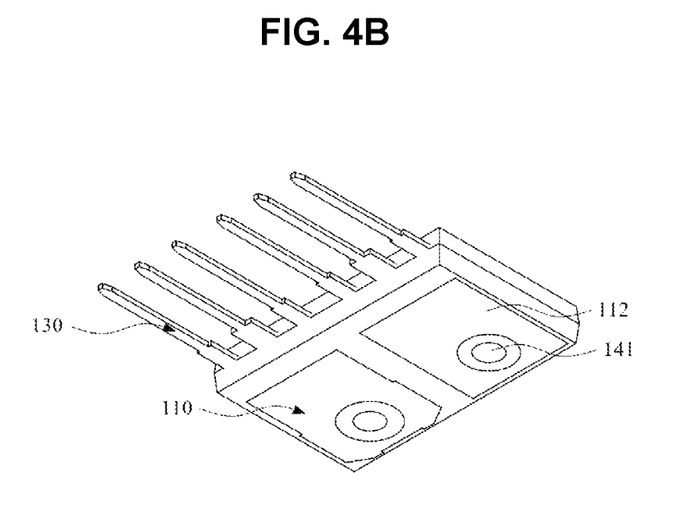
Figure 5:
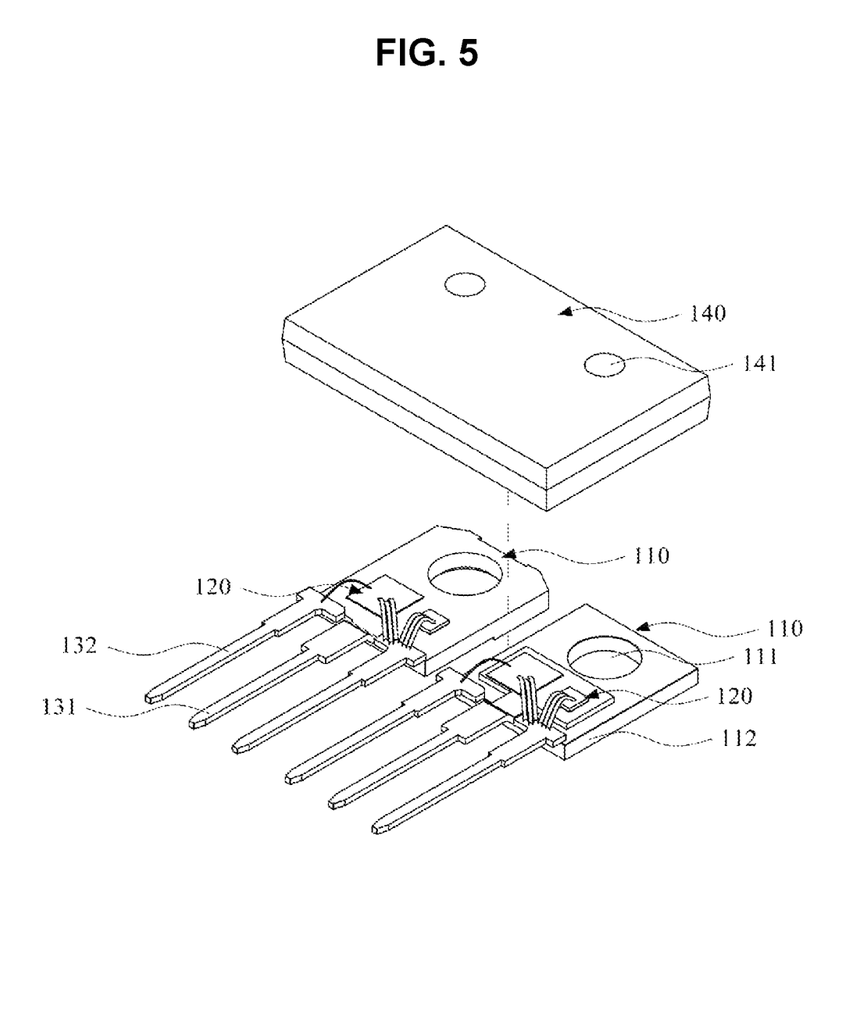
FIG. 5 is an exploded perspective view of the coupled semiconductor package of FIGS. 4A and 4B.

As illustrated in FIG. 4B, one or more substrate pads 110 are formed of a conductive metal and the lower surfaces formed of the conductive metal are exposed to the outside of one surface of the package housing 140 so as to be electrically connected. Also, another one or more substrate pads 110 are formed of an insulating substrate, where an insulating layer 112 is formed, and the lower surfaces of the insulating substrates are exposed to the outside of one surface of the package housing 140 so as to be electrically insulated. Accordingly, insulation may be partly realized when the package is joined to a heat sink (not illustrated).

The lower surfaces of one or more substrate pads 110 may be partly or entirely exposed to the outside of the package housing 140. For example, more than 90% of the area of the lower surfaces of one or more substrate pads 110 is exposed to the outside of one surface of the package housing 140 so as to maximize heat radiation effect.

In this regard, when insulation of a heat sink is needed, a separate insulating material is not needed to be applied to the heat sink and thus, a process of manufacturing a semiconductor package may be simplified.

Next, one or more semiconductor chips 120 are installed on each of the substrate pads 110 by using a conductive adhesive interposed therebetween.

For reference, the conductive adhesive may contain more than 40% of Sn or more than 50% of Ag or Cu, however, the present invention is not limited thereto. Also, a silicon control rectifier (SCR), a power transistor, an insulated gate bipolar transistor (IGBT), a metal-oxide semiconductor field effect transistor (MOSFET), a power rectifier, a power regulator, or a power semiconductor including a combination thereof may be applied as the semiconductor chip 120.

Next, each of the terminals 130 is electrically connected to each of the substrate pads 110 and each of the semiconductor chips 120 and may include the first terminal 131 electrically connected to the substrate pad 110 and the second terminal 132 electrically connected to the semiconductor chip 120.

The first terminal 131, which is a lead terminal applying an electric signal to the substrate pad 110, is electrically connected to the substrate pad 110, wherein one or more substrate pads 110 and one or more terminals 130 may be formed of the same material and connected to each other as in one body. Also, one or more substrate pads 110 and one or more terminals 130 may be separately formed and connected to each other using ultrasonic welding, soldering, or laser welding.

Here, the terminals 130 may contain more than 40 weight % of Al with respect to the total weight of the terminals 130 so that weight lighting may be realized and conductivity may be improved.

In addition, one or more semiconductor chips 120 and one or more terminals 130 may be formed of Au, Al, or Cu as a single material and electrically connected to each other. Also, one or more semiconductor chips 120 and one or more terminals 130 may be formed of a combined material including at least any one of Au, Al, and Cu and electrically connected to each other. Here, electrical connection may be, for example, a wire.

Moreover, one or more semiconductor chips 120 and one or more terminals 130 may be electrically connected to each other through a metal clip and thus, electrical stability may be secured.

Next, the package housing 140 is an insulator for protecting a semiconductor circuit, partially covers one or more semiconductor chips 120 and one or more terminals 130, and may be formed of an EMC. However, the present invention is not limited thereto and the package housing 140 may be formed of PPS or PBT.

The package housing 140 includes at least one penetration hole 141 and the substrate pad 110 includes the hole 111 that corresponds to the penetration hole 141. Accordingly, the package housing 140, the substrate pad 110, and a heat sink may be combined to each other through screw tightening.

The coupled semiconductor package according to the third embodiment of the present invention is described in more detail below with reference to FIGS. 6A through 8.

Firstly, the substrate pads 110 are lead frames, where the semiconductor chips 120 are installed, and the at least two substrate pads 110 are separately molded in the package housing 140. Also, the lower surfaces of one or more substrate pads 110 are formed to be electrically connected and the lower surfaces of another one or more substrate pads 110 are formed to be electrically insulated.

Figure 6A:
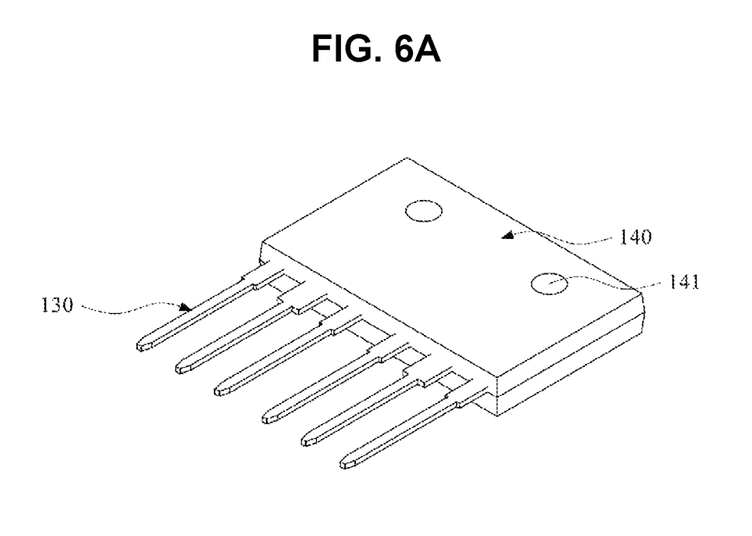
FIGS. 6A and 6B illustrate a coupled semiconductor package according to a third embodiment of the present invention.
Figure 6B:
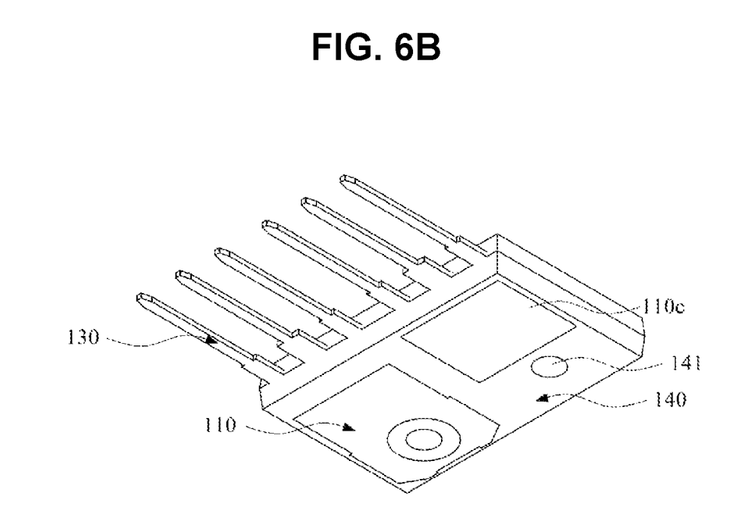
Figure 7:
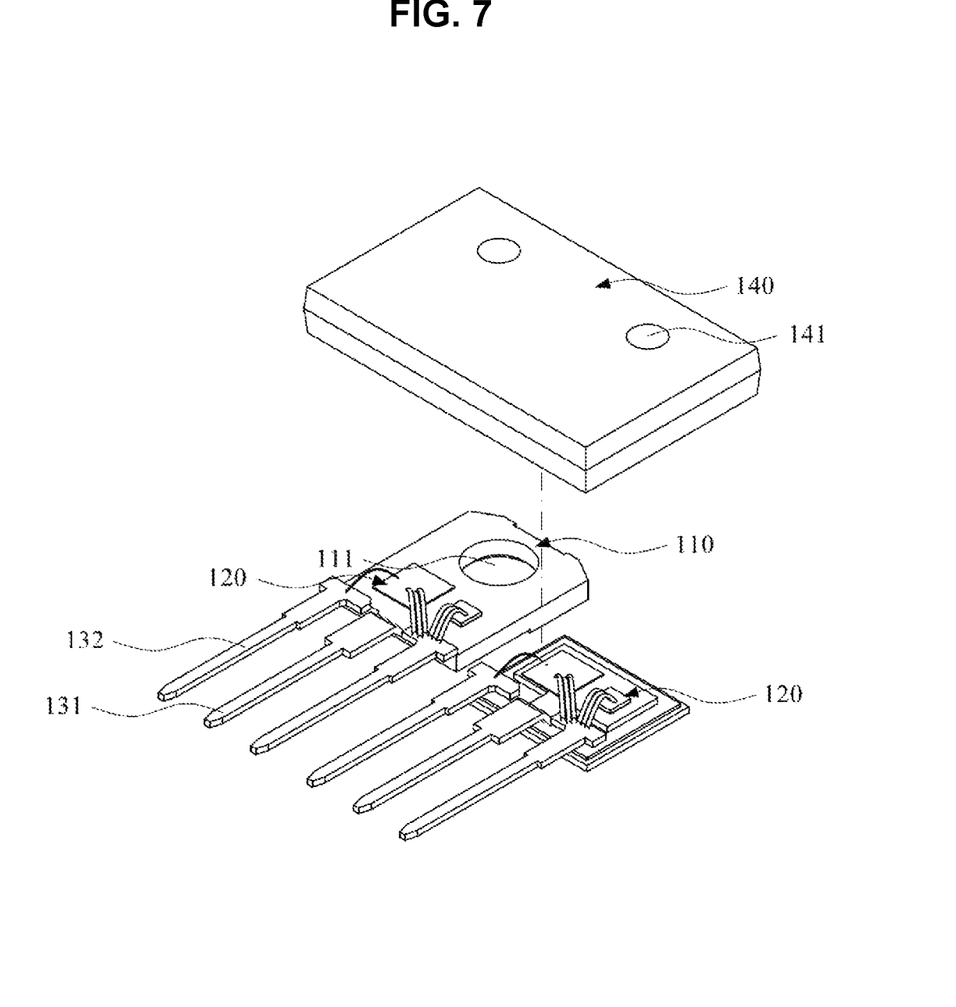
FIGS. 7 and 8 are exploded perspective views of the coupled semiconductor package of FIGS. 6A and 6B.
Figure 8:
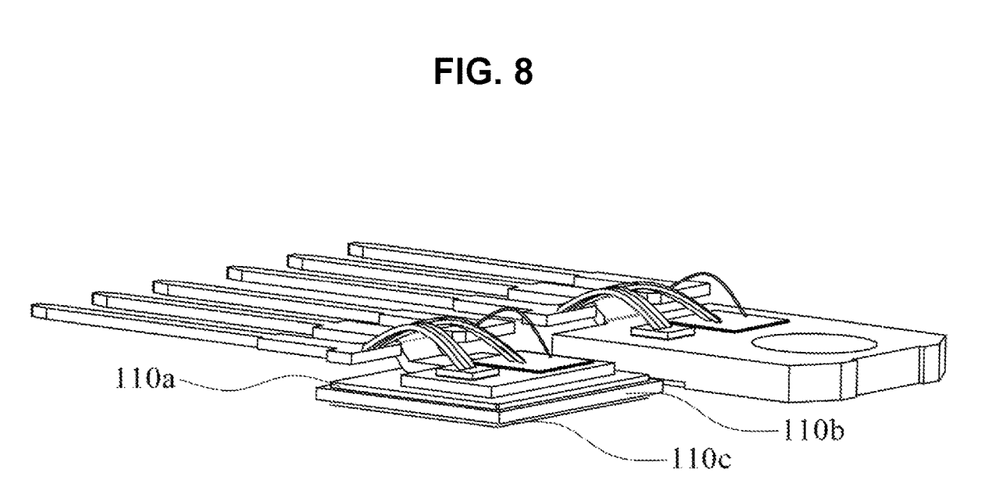

That is, as illustrated in FIGS. 6B and 8, one or more substrate pads 110 are formed of a conductive metal and the lower surfaces formed of the conductive metal are exposed to the outside of one surface of the package housing 140 so as to be electrically connected. Also, another one or more substrate pads 110 are formed of a metal layer 110a, an insulating layer 110b, and a metal layer 110c, which are sequentially stacked, for example, a direct bonded copper substrate (DBC), and the lower surfaces of the substrate pads 110 are exposed to the outside of one surface of the package housing 140 so as to be electrically insulated. Accordingly, insulation may be partly realized when the package is joined to a heat sink (not illustrated).

Here, the insulating layer 110b includes ceramic ($Al_2O_3$), AlN, or $Si_3N_4$ and thereby, provides an insulating structure between the metal layer 110a and the metal layer 110c.

The lower surfaces of one or more substrate pads 110 may be partly or entirely exposed to the outside of the package housing 140. For example, more than 90% of the area of the lower surfaces of one or more substrate pads 110 is exposed to the outside of one surface of the package housing 140 so as to maximize heat radiation effect.

In this regard, when insulation of a heat sink is needed, a separate insulating material is not needed to be applied to the heat sink and thus, a process of manufacturing a semiconductor package may be simplified.

Next, one or more semiconductor chips 120 are installed on each of the substrate pads 110 by using a conductive adhesive interposed therebetween.

For reference, the conductive adhesive may contain more than 40% of Sn or more than 50% of Ag or Cu, however, the present invention is not limited thereto. Also, a silicon control rectifier (SCR), a power transistor, an insulated gate bipolar transistor (IGBT), a metal-oxide semiconductor field effect transistor (MOSFET), a power rectifier, a power regulator, or a power semiconductor including a combination thereof may be applied as the semiconductor chip 120.

Next, each of the terminals 130 is electrically connected to each of the substrate pads 110 and each of the semiconductor chips 120 and may include the first terminal 131 electrically connected to the substrate pad 110 and the second terminal 132 electrically connected to the semiconductor chip 120.

The first terminal 131, which is a lead terminal applying an electric signal to the substrate pad 110, is electrically connected to the substrate pad 110, wherein one or more substrate pads 110 and one or more terminals 130 may be formed of the same material and connected to each other as in one body. Also, one or more substrate pads 110 and one or more terminals 130 may be separately formed and connected to each other using ultrasonic welding, soldering, or laser welding.

Here, the terminals 130 may contain more than 40 weight % of Al with respect to the total weight of the terminals 130 so that weight lighting may be realized and conductivity may be improved.

In addition, one or more semiconductor chips 120 and one or more terminals 130 may be formed of Au, Al, or Cu as a single material and electrically connected to each other. Also, one or more semiconductor chips 120 and one or more terminals 130 may be formed of a combined material including at least any one of Au, Al, and Cu and electrically connected to each other. Here, electrical connection may be, for example, a wire.

Moreover, one or more semiconductor chips 120 and one or more terminals 130 may be electrically connected to each other through a metal clip and thus, electrical stability may be secured.

Next, the package housing 140 is an insulator for protecting a semiconductor circuit, partially covers one or more semiconductor chips 120 and one or more terminals 130, and may be formed of an epoxy molding compound (EMC). However, the present invention is not limited thereto and the package housing 140 may be formed of a polyphenylene sulfide (PPS) or polybutylene terephthalate (PBT).

The package housing 140 includes at least one penetration hole 141 and the substrate pad 110 includes the hole 111 that corresponds to the penetration hole 141. Accordingly, the package housing 140, the substrate pad 110, and a heat sink may be combined to each other through screw tightening.

According to the coupled semiconductor package described above, at least two substrate pads are molded in the package housing having a single structure, wherein a part of the substrate pads is exposed and the other part of the substrate pads is not exposed. Accordingly, partial insulation may be economically realized without applying an insulating material to the heat sink, when the package is joined to the heat sink. Also, a part of the substrate pads is formed of an insulating substrate or a DBC substrate and thereby, at least two substrate pads are exposed so that partial insulation may be economically realized without applying an insulating material to the heat sink, when the package is joined to the heat sink.

According to the present invention, at least two substrate pads are molded in the package housing having a single structure, wherein a part of the substrate pads is exposed and the other part of the substrate pads is not exposed. Accordingly, partial insulation may be economically realized without applying an insulating material to the heat sink, when the package is joined to the heat sink.

In addition, a part of the substrate pads is formed of an insulating substrate or a DBC substrate and thereby, at least two substrate pads are exposed so that partial insulation may be economically realized without applying an insulating material to the heat sink.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A coupled semiconductor package comprising:
first and second substrate pads;
at least one semiconductor chip installed on each of the first and second substrate pads;
at least one terminal each of which is electrically connected to each substrate pad and each semiconductor chip; and
a package housing covering a part of the at least one semiconductor chip and the at least one terminal,
wherein the first substrate pad is formed of a conductive metal, a lower surface of the first substrate pad is partly or entirely exposed to an outside of the package housing so as to be electrically connected, the second substrate pad is formed of an insulating substrate including an insulating layer, and a lower surface of the insulating substrate is partly or entirely exposed to the outside of the package housing so as to be electrically insulated,
wherein the insulating substrate further includes an upper metal layer and a lower metal layer, and the lower metal layer, the insulating layer, and the upper metal layer are sequentially stacked.

2. The coupled semiconductor package of claim 1, wherein the package housing is formed of an epoxy molding compound (EMC).

3. The coupled semiconductor package of claim 1, wherein the insulating layer includes ceramic (Al2O3), AlN, or Si3N4.

4. The coupled semiconductor package of claim 1, wherein the first substrate pad and the terminal connected to the first substrate pad are formed of a same material and connected to each other as in one body.

5. The coupled semiconductor package of claim 1, wherein the first substrate pad and the terminal connected to the first substrate pad are separately formed and connected to each other using ultrasonic welding, soldering, or laser welding.

6. The coupled semiconductor package of claim 1, wherein the terminals contain more than 40 weight % of Al with respect to the total weight of the terminals.

7. The coupled semiconductor package of claim 1, wherein the package housing includes one or more penetration holes.

8. The coupled semiconductor package of claim 7, wherein the first and second substrate pads include holes that correspond to the penetration holes.

9. The coupled semiconductor package of claim 8, further comprising a heat sink combined using a connecting means which penetrates the penetration holes and the holes.

10. The coupled semiconductor package of claim 1, wherein the lower surface of the first substrate pad is exposed to the outside of the package housing by more than 90% of an area of the lower surface of the first substrate pad.

11. The coupled semiconductor package of claim 1, wherein the at least one semiconductor chip and the at least one terminal are formed of Au, Al, or Cu as a single material so as to be electrically connected to each other, or formed of a combined material including at least any one of Au, Al, and Cu so as to be electrically connected to each other.

12. The coupled semiconductor package of claim 1, wherein the at least one semiconductor chip and the at least one terminal are electrically connected to each other using a conductive wire.

13. The coupled semiconductor package of claim 1, wherein the at least one semiconductor chip and the at least one terminal are electrically connected to each other using a metal clip.

* * * * *